United States Patent
Derouen

(10) Patent No.: US 9,535,475 B2
(45) Date of Patent: Jan. 3, 2017

(54) SYSTEM AND METHOD FOR CREATING HIGH POWERED EMC COMPLIANT POWER SUPPLY FOR INDUSTRIAL AND MILITARY APPLICATIONS

(71) Applicant: Crystal Group Inc., Hiawatha, IA (US)

(72) Inventor: Alvin Derouen, Marion, IA (US)

(73) Assignee: Crystal Group, Inc., Hiawatha, IA (US)

( * ) Notice: Subject to any disclaimer, the term of this patent is extended or adjusted under 35 U.S.C. 154(b) by 190 days.

(21) Appl. No.: 14/171,294

(22) Filed: Feb. 3, 2014

(65) Prior Publication Data

US 2014/0223203 A1 Aug. 7, 2014

Related U.S. Application Data

(60) Provisional application No. 61/760,422, filed on Feb. 4, 2013.

(51) Int. Cl.
*G06F 1/26* (2006.01)
*G06F 1/18* (2006.01)

(52) U.S. Cl.
CPC .............. *G06F 1/26* (2013.01); *G06F 1/188* (2013.01)

(58) Field of Classification Search
CPC ................................. G06F 1/188; G06F 1/26
See application file for complete search history.

(56) References Cited

U.S. PATENT DOCUMENTS

| | | | | |
|---|---|---|---|---|
| 5,945,746 A | * | 8/1999 | Tracewell | H05K 7/20572 165/104.33 |
| 2005/0078422 A1 | * | 4/2005 | Pincu | G06F 1/263 361/62 |
| 2006/0132061 A1 | * | 6/2006 | McCormick | H02M 1/4258 315/291 |
| 2009/0243756 A1 | * | 10/2009 | Stevenson | H01G 4/40 333/172 |
| 2010/0250977 A1 | * | 9/2010 | Huang | G06F 1/28 713/300 |
| 2015/0131270 A1 | * | 5/2015 | Geisler | F21V 33/002 362/133 |

* cited by examiner

*Primary Examiner* — Thomas Lee
*Assistant Examiner* — Mohammad A Rahman
(74) *Attorney, Agent, or Firm* — Simmons Perrine Moyer Bergman PLC

(57) ABSTRACT

The present invention is an apparatus and method for provisioning a compact power filter connection to a well-grounded connector in such a way as to include a capacitive and inductive circuit connection, extremely near the connector and filter, such that EMC compatibility is created in a space roughly 30% of traditional mechanisms and design approach to satisfy the aforementioned needs, provide the previously stated objects, include the above-listed features, and achieve the already articulated advantages. The present invention is carried out in a "post-internal ferrite bead re-radiation noise-less" manner, in a sense that ability to have noise introduced back onto a post-ferrite bead line has been greatly reduced.

20 Claims, 6 Drawing Sheets

SYSTEM AND METHOD FOR CREATING HIGH POWERED EMC COMPLIANT POWER SUPPLY FOR INDUSTRIAL AND MILITARY APPLICATIONS

FIELD OF THE INVENTION

The present invention generally relates to computers and electronic equipment, and more particularly relates to industrial and military computers, and even more particularly relates to methods and systems for providing electromagnetic compatible (EMC) power supply units for industrial and military computer systems and electronic equipment.

BACKGROUND OF THE INVENTION

In recent years, industrial and military computers have become increasingly prevalent in many industries. It is not uncommon today to see rows of high performance computers, or servers, arranged in racks or specialized computers in mining or sensitive deployed military application. These computers, as well as other electronic devices and their peripherals, increasingly need more and more power. With increased power, typically comes an increase in electrical noise, which has an undesirable impact on the operation of equipment within the area. These pieces of equipment are typically sensitive to electromagnetic radiation. The levels being discussed here are well below the conventional concerns typically dealt with by compliance to UL, FCC, TUV, CE and CSA EMC standards. The need for complying with the lower levels are entirely due to the application the computers are being used. While many of these industrial and military power supplies are often designed and manufactured to higher standards than typical power supplies for consumer electronics and computers, they still are occasionally insufficient to meet the even higher military and commercial aviation standards such as MIL-STD-461 and DO-160. MIL-STD-461 is a United States Military Standard that describes, among other things, how to test equipment for electromagnetic compatibility. DO-160, Environmental Conditions and Test Procedures for Airborne Equipment, is a standard for environmental tests of avionics hardware published by RTCA, Incorporated. Both of these documents are used to help power supply designers create EMC compliant products.

It is also common for computer power supplies to meet the Advanced Technology eXtended (ATX) specification for motherboards and associated power supplies.

However, the increasing power needs and the physical size and volume limitations of the industrial standard form factor has posed a formidable challenge for high power (greater than 300 Watts) 18-36 volt or higher power supplies which meet both the MIL-STD-461 and the DO-160, while still meeting the ATX industry specification, as one example. Solving this problem in a unique way has created a broader application of a method to create compact EMC compliant power sources for these industries. Minimizing the conducted and radiated susceptibility paths from the rear connector of the power source to the filter mechanism, typically a common mode or differential mode choke, can provide the greatest EMC benefit in a power supply front end filter system.

Consequently, there exists a need for improved methods and systems for connecting the connector to the primary EMI filter in a system. This problem has prevented the industry from supplying a minimum of 300 watts at a minimum of 18 Volts, power from within an industry standard form factor, such as a 1U ATX, while simultaneously meeting the ATX specification and both the MIL-STD-461 and the DO-160 specifications, all done in a reliable and cost efficient manner.

SUMMARY OF THE INVENTION

It is an object of the present invention to provide a system and method for supplying power from a military circular connector to the primary filter of a power supply in such a way as to reliably and easily meet MIL-STD-461 and the DO-160 test criteria in an efficient manner.

It is a feature of the present invention to utilize a military pin and socket connector on a case of a military or industrial power supply.

It is another feature of the present invention to include a minimum power output capacity of 300 Watts.

It is yet another feature of the present invention to have a ferrite bead disposed adjacent the power provisioning outlet conductor.

It is still another feature to have a capacitive circuit board disposed immediately adjacent to said ferrite bead and the military pin and socket connector.

It is an advantage of the present invention to provide a compact power supply with greater than 300 watts, which meets military and commercial aviation standards.

It is still an advantage to create a power supply meeting these criteria in an industry standard ATX form factor.

The present invention is an apparatus and method for provisioning a compact power filter connection to a well grounded connector in such a way as to include a capacitive and inductive circuit connection, extremely near the connector and filter, such that EMC compatibility is created in a space roughly 30% of traditional mechanisms, and design approach to satisfy the aforementioned needs, provide the previously stated objects, include the above-listed features, and achieve the already articulated advantages. The present invention is carried out in a "post-internal ferrite bead re-radiation noise-less" manner in a sense that ability to have noise introduced back onto a post-ferrite bead line, has been greatly reduced.

Accordingly, the present invention is a system comprising a case, configured with shielding, to reduce EMI emissions therefrom;

power supply circuitry disposed in said case and configured to deliver power;

an output connector with a low inductance path from said capacitive circuit board to said case;

with a shell portion which is grounded to said case;

a power provisioning line coupled to said circuitry and providing power to said output connector;

a capacitive circuit board coupled directly to said output connector and said power provisioning line;

a ferrite bead disposed about a terminal portion of said power provisioning line; and a low inductance path from said capacitive circuit board to said case.

A compact and efficient method of minimizing the exposed unfiltered power to the majority of the power supply components by creating a circuit card juxtaposed to the connector, containing capacitive, inductive, and resistive elements in conjunction with one or several juxtaposed ferrite beads which create a pre-filter system in a fraction of the space, which provides superior EMI characteristics compliant with MIL-STD 461 and DO-160.

BRIEF DESCRIPTION OF THE DRAWINGS

The invention may be more fully understood by reading the following description of the preferred embodiments of the invention, in conjunction with the appended drawings wherein.

DETAILED DESCRIPTION

Figure 1:
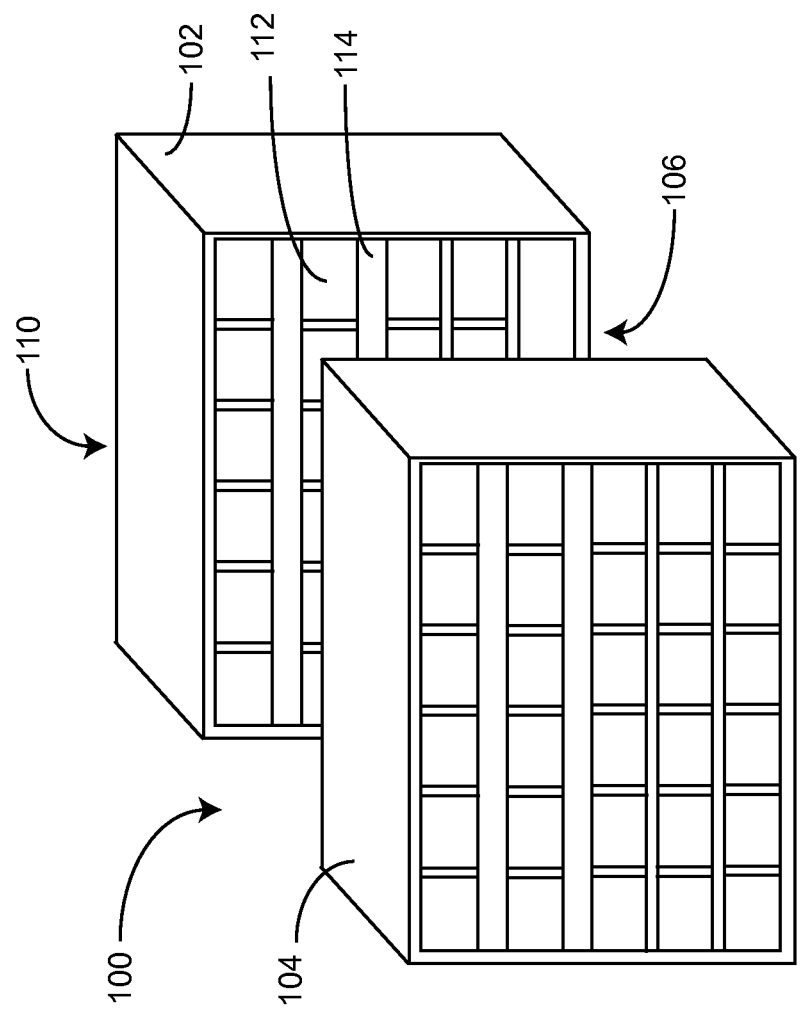
FIG. 1 is a perspective view of a prior art rack-mounted industrial computer system.

Now referring to the drawings wherein like numerals refer to like matter throughout, and more specifically referring to FIG. 1, there is shown a system of the prior art, generally designated 100, including a first rack 102 of industrial power supplies, industrial personal computers and associated hardware and accessories, and a second rack 104 of similar items, with an aisle 106 disposed there between. First rack 102 is representative of second rack 104 and is shown in detail to include a plurality of columns of industrial electronic components 110. A large industrial computing component 112 is shown disposed in first rack of industrial personal computers 102. A 1U-sized industrial electronic component 114 is shown disposed at an intermediate height of first rack 102. A technician may walk in the aisle 106 between first rack 102 and second rack 104 for various reasons, including installation or repair of components, monitoring or data entry into computers in first rack 102, etc.

Figure 2:
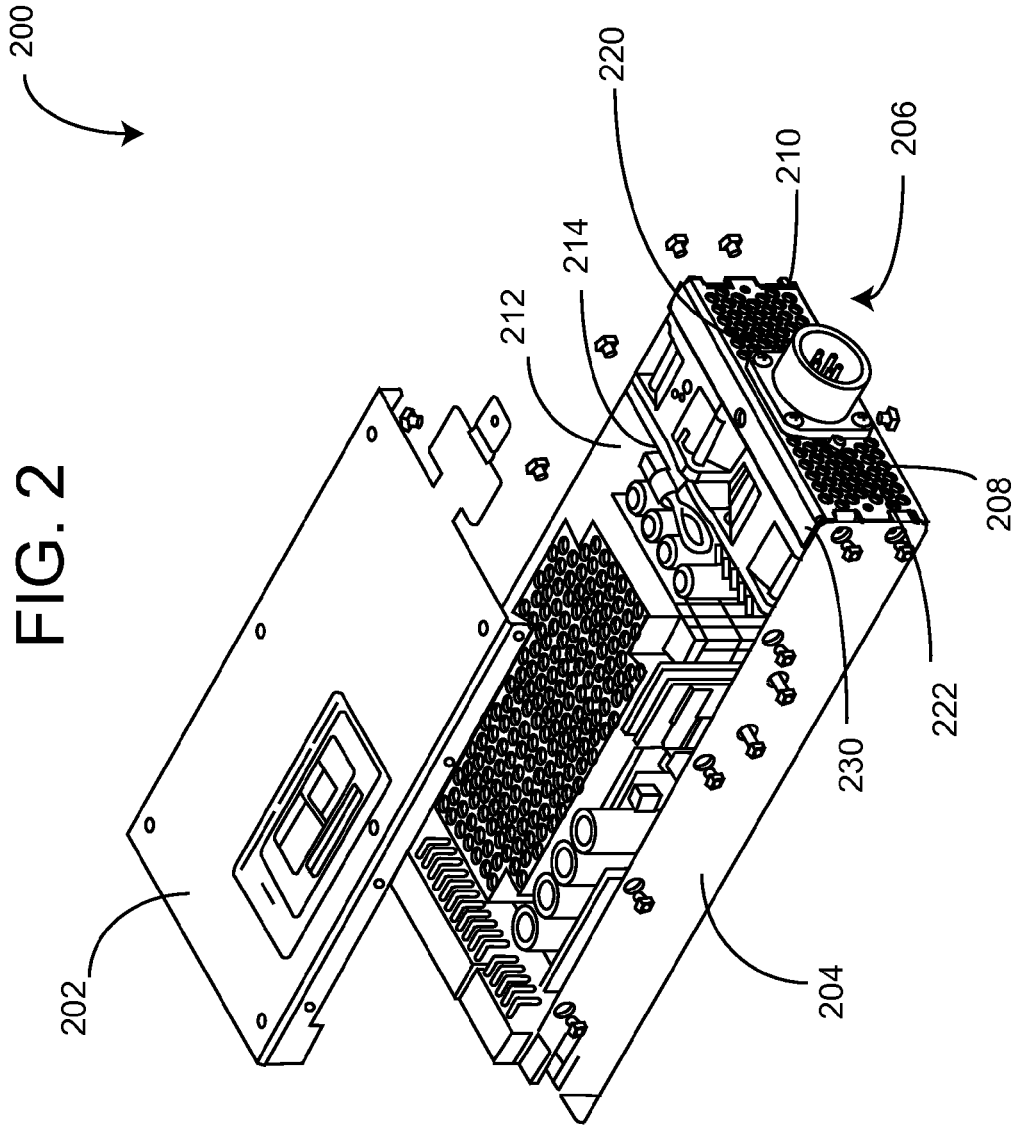
FIG. 2 is a simplified perspective view of a 1U system of the present invention.

Now referring to FIG. 2, there is shown a system of the present invention, including a 1U industrial ATX power supply generally designated 200, which is sized and configured for insertion into a 1U receiving bay 120. The term "1U" is well known in the art to describe a form factor which is approximately 1¾ inches in height.

Throughout this description, the terms "industrial computer" or "industrial computer power supply" are used to represent electronic components of the type which is capable of being stored in racks of multiple rows, where each row has 1U units and where the units are coupled to wiring associated with the rack and other equipment by at least one connector.

Referring to FIG. 2, there is further shown a top cover 202 and a bottom 1U body 204, a military pin and socket connector 206 which is mounted on an end of 1U system 200 between ventilation areas 208 and 210. Connector 206 is coupled to ventilation areas 208 and 210 via screw holes 222 and 220, respectively. NOTE: Screws are shown disposed in said screw holes. A body end top portion 230 is shown as well. Inside body 204, there are also shown power connectors 212 and 214. Connector 206 is grounded to 1U body 204 in 360 degrees of longitudinal orientation (as referenced to the pin orientation in the connector 206).

Figure 3:
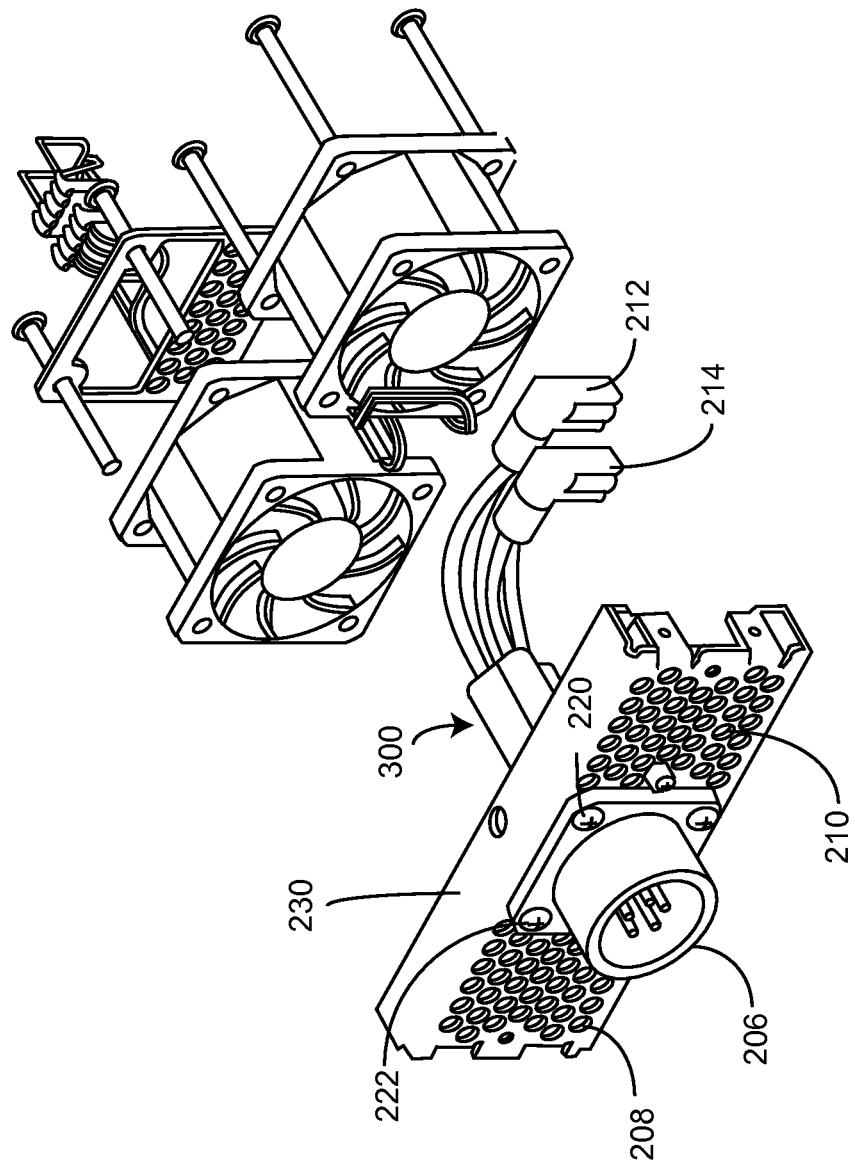
FIG. 3 is a perspective view of a portion of the 1U system of FIG. 2.

Now referring to FIG. 3, there is shown a single ferrite bead 300, which may be a multi-aperture Balun type ferrite core.

Figure 4:
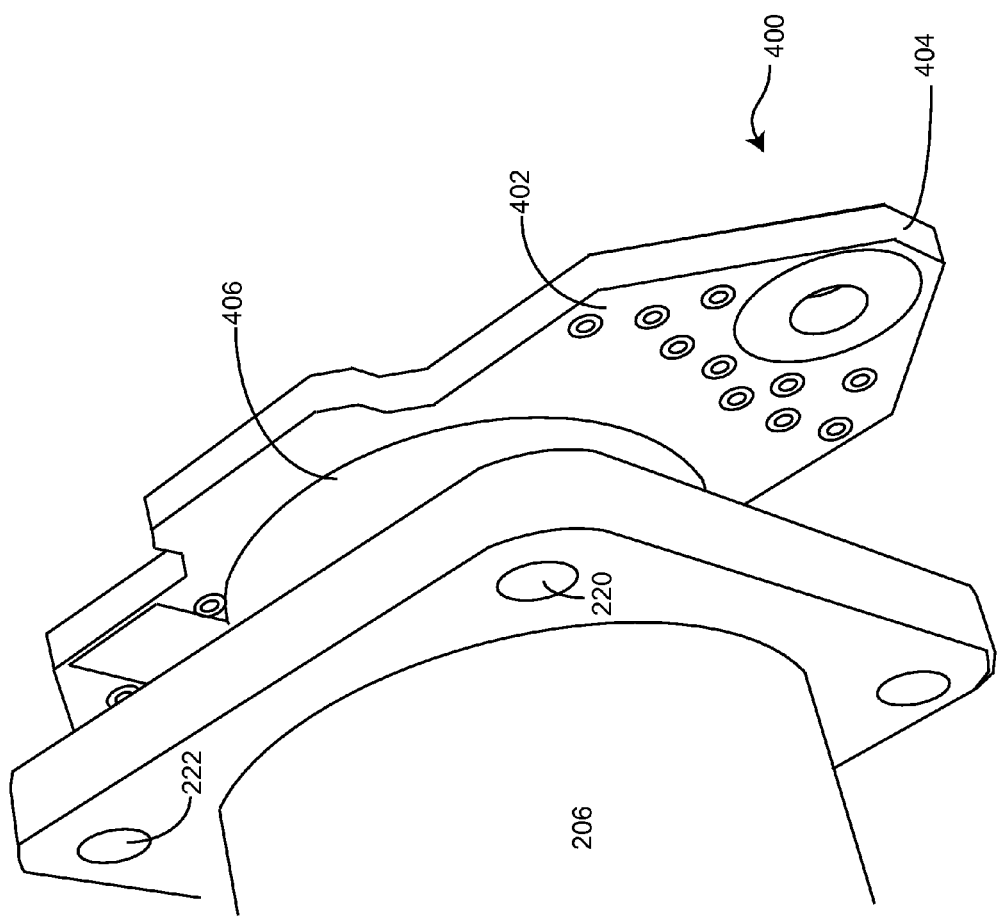
FIG. 4 is a perspective view of a portion of the system of the present invention.

Now referring to FIG. 4, there is shown a close up view of the connector 206 being mounted directly at connection 406 to a circuit board 400 on a connector facing side 402, which is opposite an internal facing side 404. An inductance path to chassis ground is made with the circuit board 400 via connection 406.

Figure 5:
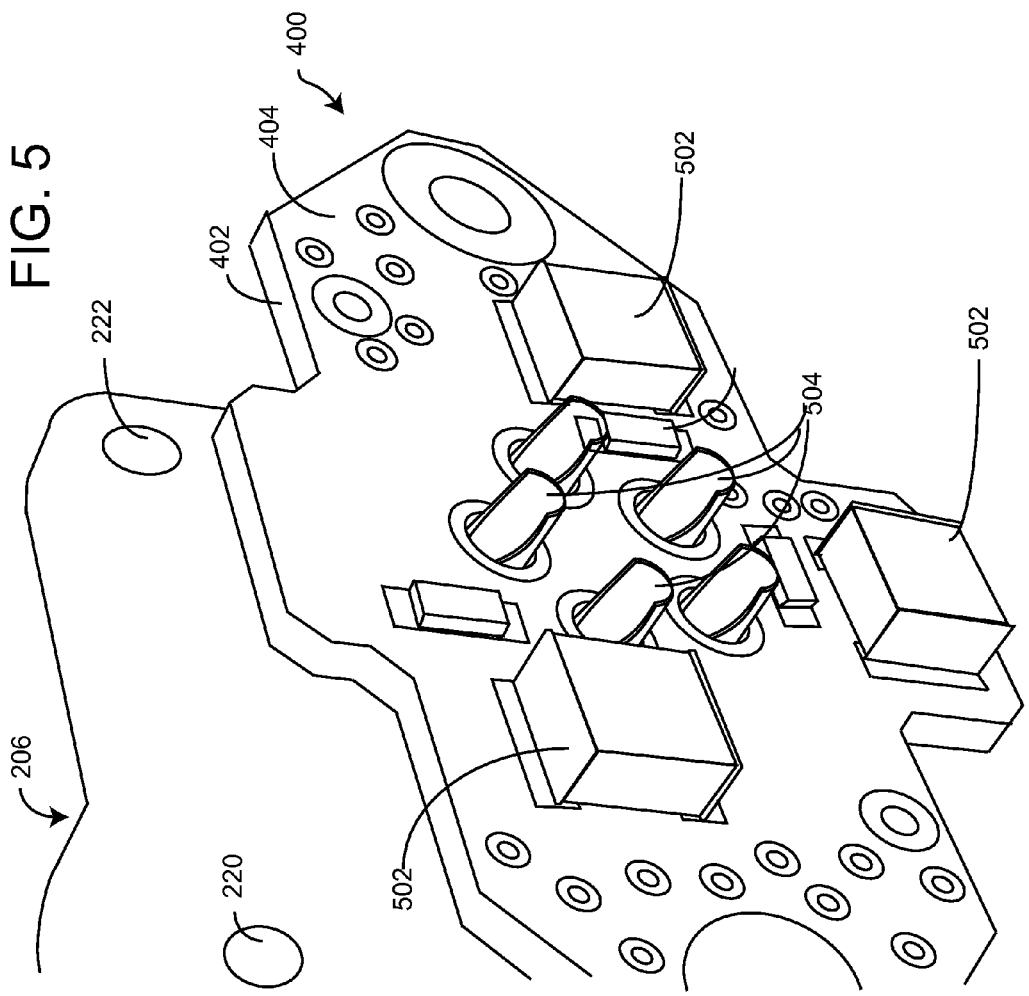
FIG. 5 is a perspective view of a portion of the system of the present invention, which is looking in an opposing direction from FIG. 4.

Now referring to FIG. 5, there is shown a view of the connector 206 and circuit board 400 of FIG. 4 being viewed from an opposing direction. Internal facing side 404 is visible while the opposite side, the connector facing side 402, is concealed. Five circular solder tail connectors 504 are shown extending through circuit board 400 and inwardly to the 1U body, and a plurality of capacitors 502 are shown disposed on circuit board 400. It should be noted that only four wires are coupled to these connectors 504, with the remaining connector being a connection to ground with no wire attached. Portions of the ground connector 504 are not required for operation.

Figure 6:
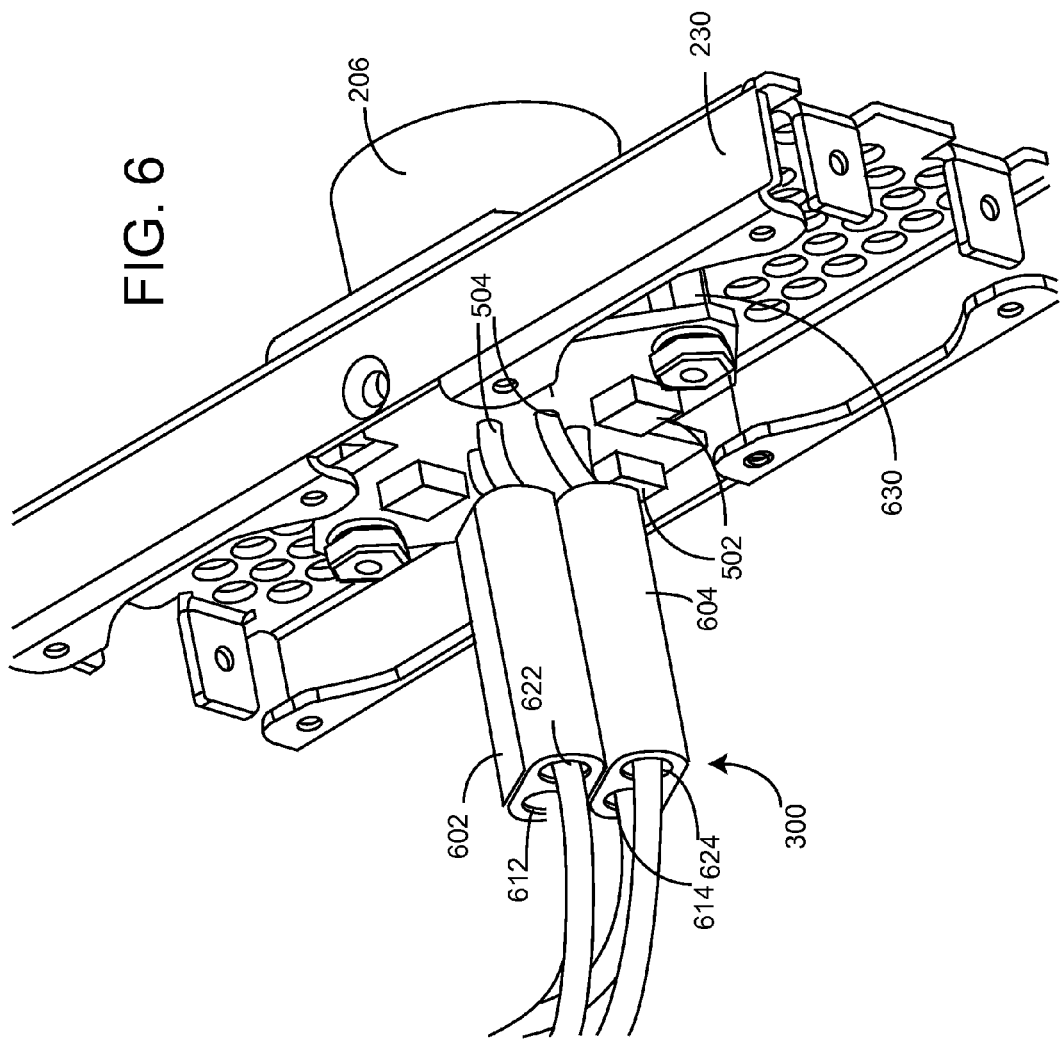
FIG. 6 is a perspective view of the present invention, which is looking in an opposing direction from FIG. 4.

Now referring to FIG. 6, there is shown more detail of the internal facing side 404 of the circuit board 400. The single bead 300 comprises a plurality of Balun type ferrite cores 602 and 604. Apertures 612 and 622, together with apertures 614 and 624, are shown in ferrite cores 602 and 604, respectively. The apertures 612, 622, 614 and 624 are sized and configured to receive circular solder tail connectors 504 therein so as to minimize the ability of these connectors to act as antennas. FIG. 6 shows the connectors 504 outside of the apertures. Also shown is an extremely low inductance path 630 to the chassis ground.

Throughout this description, reference is made to an industrial PC and to a printed circuit board, because it is believed that the beneficial aspects of the present invention would be most readily apparent when used in connection with industrial PCs and printed circuit boards; however, it should be understood that the present invention is not intended to be limited to industrial PCs and printed circuit boards and should be hereby construed to include other non-industrial PCs and non-printed circuit boards as well.

It is thought that the method and apparatus of the present invention will be understood from the foregoing description and that it will be apparent that various changes may be made in the form, construct steps, and arrangement of the parts and steps thereof, without departing from the spirit and scope of the invention or sacrificing all of their material advantages. The form herein described is merely a preferred exemplary embodiment thereof.

I claim:

1. A 1U rack system for provisioning at least 300 watts of power, which is compliant with MIL-STD 461 and DO-160 comprising:
    a rack configured for containing a plurality of 1U industrial electronic components; and
    a 1U industrial power supply disposed in said rack, said power supply comprising:
        a shielded case;
        a power output connector grounded to said case said power output connector comprising a plurality of pins;
        a power provisioning line coupled to a power provisioning pin of said plurality of pins in said power output connector;
        power source circuitry, completely disposed with said case, which is configured to provide at least 300 watts of power at least 20V through said power provisioning line;

a ferrite bead disposed at and about a terminal portion of said power provisioning line, where said ferrite bead is not a core of a toroidally wound inductor;

a circuit board electrically and mechanically coupled to said power output connector and directly coupled to said power provisioning line;

said circuit board containing a combination of resistive, capacitive and inductive components configured to provide electro-magnetic interference (EMI) filtering; and said ferrite bead and said circuit board configured to operate in combination to filter high frequency noise from said power provisioning line and to reduce EMI emissions from said shielded case.

2. A system of claim 1 wherein said ferrite bead is a multi-aperture ferrite bead.

3. The system of claim 2 further comprising a plurality of fans disposed inside said case and on opposing sides of said single ferrite bead.

4. The system of claim 2 where said circuit board has an internal facing side and a connector facing side where said connector facing side is soldered directly to said power output connector.

5. The system of claim 4 wherein said power output connector is a substantially circular military power output connector, which is grounded in 360 degrees to said shielded case.

6. The system of claim 4 wherein said power provisioning line is one of a plurality of lines, all of which are coupled at said circuit board at a central location on said circuit board.

7. The system of claim 6 wherein said circuit board has a periphery region around said central location wherein said periphery region has a plurality of capacitors disposed therein.

8. The system of claim 7 wherein said circuit board is coupled to said shielded case with a low inductance path to ground.

9. The system of claim 8 wherein said low inductance path to ground comprises a bolt extending between said circuit board and said case.

10. The system of claim 9 wherein each of said plurality of lines is disposed in an aperture of said multi-aperture ferrite bead.

11. A power supply in a 1U LRU comprising:
a case, configured with shielding to reduce EMI emissions therefrom;
power supply circuitry disposed in said case and configured to deliver power;
an output connector with a shell portion which is grounded to said case;
a power provisioning line coupled to said circuitry and providing power to said output connector;
a capacitive circuit board coupled directly to said output connector and said power provisioning line;
a low inductance path from said capacitive circuit board to said case;
a ferrite bead disposed about a terminal portion of said power provisioning line, where said ferrite bead is not a core of a toroidally wound inductor; and a low inductance path from said capacitive circuit board to said case.

12. The power supply of claim 11 wherein said ferrite bead comprises a multi-aperture ferrite bead.

13. The power supply of claim 11 wherein said ferrite bead is free of any direct physical contact with said capacitive circuit board.

14. The power supply of claim 11 wherein said ferrite bead is separated from said capacitive circuit board by a portion of said power provisioning line.

15. The power supply of claim 11 wherein said case is a 1U LRU.

16. The power supply of claim 11 wherein said capacitive circuit board has a central zone comprising a connector for coupling directly with said power provisioning line.

17. The power supply of claim 16 wherein said central zone is immediately surrounded by a zone comprising a plurality of capacitors.

18. The power supply of claim 17 wherein said central zone has an unmated connector protruding away from said capacitive circuit board and away from said output connector.

19. The power supply of claim 18 wherein said unmated connector is free of any connection to a conductor line not located within said capacitive circuit board.

20. A power supply in a 1U LRU comprising:
a 1U LRU case, configured with shielding to reduce EMI emissions therefrom;
power supply circuitry disposed in said case and configured to deliver at least 300 watts of power at least 20V;
an output connector with a shell portion which is grounded to said case;
a power provisioning line coupled to said circuitry and providing power to said output connector;
a capacitive circuit board coupled directly to said output connector and said power provisioning line;
a ferrite bead having a first aperture disposed about a terminal portion of said power provisioning line, where said ferrite bead is not a core of a toroidally wound inductor;
a low inductance path from said capacitive circuit board to said case;
wherein said ferrite bead is free of any direct physical contact with said capacitive circuit board;
wherein said ferrite bead is separated from said capacitive circuit board by a portion of said power provisioning line;
wherein said capacitive circuit board has a central zone comprising a connector for coupling directly with said power provisioning line;
wherein said central zone is immediately surrounded by a zone comprising a plurality of capacitors;
wherein said central zone has an unmated connector protruding away from said capacitive circuit board and away from said output connector; and
wherein said unmated connector is free of any connection to a conductor line not located within said capacitive circuit board.

* * * * *